United States Patent
Zhu et al.

(10) Patent No.: US 7,541,629 B1
(45) Date of Patent: Jun. 2, 2009

(54) EMBEDDED INSULATING BAND FOR CONTROLLING SHORT-CHANNEL EFFECT AND LEAKAGE REDUCTION FOR DSB PROCESS

(75) Inventors: Huilong Zhu, Poughkeepsie, NY (US); Haizhou Yin, Poughkeepsie, NY (US); Zhijiong Luo, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/106,658

(22) Filed: Apr. 21, 2008

(51) Int. Cl.
*H01L 29/72* (2006.01)
(52) U.S. Cl. .................. 257/288; 257/332; 257/374; 257/401; 257/510; 257/520; 257/622; 257/627; 438/198; 438/406; 438/424
(58) Field of Classification Search ............ 257/19, 257/288, 301, 332, 347, 374, 401, 510, 520, 257/616, 622, 627; 438/198, 406, 424, 486
See application file for complete search history.

(56) References Cited

U.S. PATENT DOCUMENTS

| | | | |
|---|---|---|---|
| 6,686,624 B2 | 2/2004 | Hsu | |
| 2001/0042874 A1 | 11/2001 | Lee et al. | |
| 2003/0168680 A1* | 9/2003 | Hsu | 257/296 |
| 2006/0160292 A1* | 7/2006 | Anderson et al. | 438/199 |
| 2006/0163672 A1* | 7/2006 | Wang et al. | 257/396 |
| 2006/0276011 A1 | 12/2006 | Fogel et al. | |
| 2007/0018247 A1 | 1/2007 | Brindle et al. | |
| 2007/0241323 A1 | 10/2007 | Saenger et al. | |
| 2008/0079003 A1 | 4/2008 | Shaheen et al. | |
| 2008/0199997 A1 | 8/2008 | Grebs et al. | |
| 2008/0242029 A1* | 10/2008 | Wu et al. | 438/270 |
| 2008/0258222 A1* | 10/2008 | Cannon et al. | 257/351 |

OTHER PUBLICATIONS

Joshi, Sachin, "Junction Passivation for Direct Silicon Bond Hybrid Orientation Technology," IEEE Transactions on Electron Devices, Aug. 2007, pp. 2045-2050, vol. 54, No. 8.
Sung, Chun-Yung et al., "High Performance CMOS Bulk Technology Using Direct Silicon Bond (DSB) Mixed Crystal Orientation Substrates," IEEE International Electron Device Meeting (IEDM), Dec. 2005, pp. 225-228, Vol. 5, No. 7.
Yang, M. et al., "High Performance CMOS Fabricated on Hybrid Substrate with Different Crystal Orientations," IEEE International Electron Device Meeting, Dec. 2003, pp. 18.7.1-18.7.4, vol. 8, No. 10.

* cited by examiner

*Primary Examiner*—Edward Wojciechowicz
(74) *Attorney, Agent, or Firm*—King & Spalding LLP

(57) ABSTRACT

A method and structure for reducing leakage currents in integrated circuits based on a direct silicon bonding (DSB) fabrication process. After recessing a top semiconductor layer and an underlying semiconductor substrate, a dielectric layer may be deposited and etched back to form embedded spacers. Conventional source/drain regions may then be formed.

1 Claim, 5 Drawing Sheets

EMBEDDED INSULATING BAND FOR CONTROLLING SHORT-CHANNEL EFFECT AND LEAKAGE REDUCTION FOR DSB PROCESS

FIELD OF THE INVENTION

This invention relates to semiconductor device fabrication, and more specifically to a direct silicon bonding (DSB) fabrication process.

BACKGROUND

Complementary metal-oxide-semiconductor (CMOS) integrated circuits employ both n-channel metal-oxide-semiconductor field-effect transistor (MOSFETs), in which current is carried by electrons, and p-channel MOSFETs, in which current is carried by holes. It is well known that electron and holes mobility have different dependencies on the crystallographic orientation of a semiconductor substrate. For silicon, the optimal electron mobility parallel to the substrate surface is achieved with a (100) orientation, whereas the optimal hole mobility is achieved with a (110) orientation. Conventional bulk and silicon-on-insulator (SOI) wafers provide a single crystal orientation, forcing a device designer to choose between optimal electron and hole mobility.

In recent years, several techniques have been proposed as a means to simultaneously achieve optimal electron and hole mobilities in CMOS integrated circuits. In these processes, n-channel and p-channel MOSFETs are fabricated in different areas of the wafer, having (100) and (110) orientations, respectively. An approach based on vapor-phase epitaxy is described in the article by Yang et al., IEDM 2003, pages 453-456. In this approach, a thin silicon layer of one orientation, for example (110), is bonded to an oxidized wafer of a different orientation, for example (100), thus obtaining a SOI wafer with a (110) top silicon layer and a (100) substrate. The top silicon layer and buried oxide are then selectively etched away and (100)-oriented silicon is epitaxially grown, for example by rapid thermal chemical vapor deposition, in areas where n-channel MOSFETs are to be formed. Another approach, based on solid-phase epitaxy, is described in the article by Sung et al., IEDM 2005, pages 225-228. In this approach, a thin silicon layer of one orientation, for example (110), is bonded to a wafer of a different orientation, for example (100), without an intermediate buried oxide. The top (110) silicon layer is then selectively amorphized by ion implantation and (100) regions are formed by solid-phase epitaxy by a process called amorphization-templated recrystallization (ATR). This oxide-free fabrication process is called direct silicon bonding (DSB). Further details and variations on the DSB process may be found for example in U.S. Patent Application Publication No. 2006/0276011 to Fogel et al.

One potential issue with the DSB process is that silicon layers of different orientations come into direct contact, and the resulting interface may include defects due to lattice mismatch. This may cause leakage currents parallel to the surface of the wafer. Another source of leakage may be the possible buildup of dopants at the interface between layers of different orientations, with associated increase of band-to-band tunneling due to the enhanced electric fields in the higher-doping region. Leakage currents are undesirable because they increase power consumption when a transistor is in the off-state.

SUMMARY OF THE INVENTION

In one aspect, the invention provides a device comprising a silicon substrate having a first crystal orientation; a silicon layer having a second crystal orientation, the silicon layer being bonded to a surface of the silicon substrate; a gate structure formed over the silicon layer; two recesses formed in the silicon layer and in the silicon substrate, the recesses defining two vertical sidewalls self-aligned to the gate structure, the sidewalls exposing an interface between the silicon layer and the silicon substrate; two dielectric spacers, each dielectric spacer being formed on a respective sidewall and covering the exposed interface; and two semiconducting regions, each semiconducting region being formed in a respective recess and embedding one of the dielectric spacers within the semiconductor device.

BRIEF DESCRIPTION OF THE DRAWINGS

Embodiments of the invention will now be described with reference to the appended drawings in which.

Drawings are only diagrammatic and not to scale. Corresponding elements in different drawings are indicated by the same numerals.

DETAILED DESCRIPTION

The invention will now be described with reference to specific embodiments. The description will refer to silicon-based CMOS integrated circuits, however the invention may equally apply to other material systems which exhibit different dependencies of carrier mobilities on crystal orientation.

Figure 1:
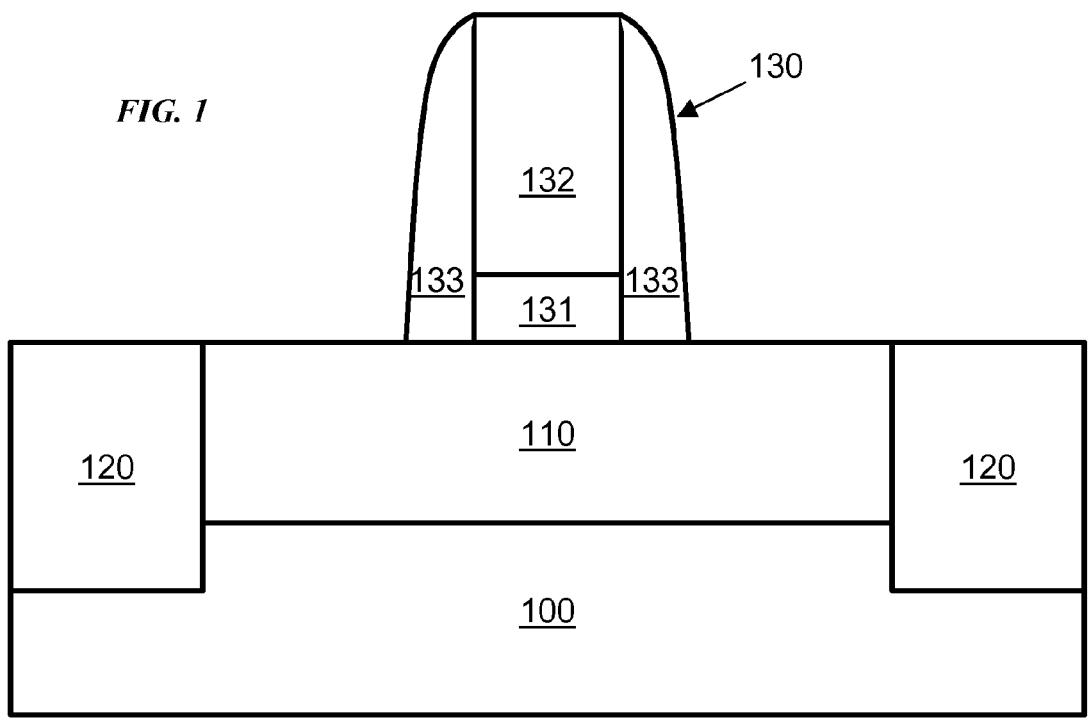
FIG. 1 shows a cross-section of a semiconductor device at a first intermediate step during fabrication in an embodiment of the invention.

FIG. 1 shows a cross-section of a semiconductor device at a first intermediate step during fabrication in an embodiment of the invention. Thin silicon layer 110 is formed over silicon substrate 100 and may have a different crystal orientation from it. For example, silicon substrate 100 may have orientation (100) and silicon layer 110 may have orientation (110). As discussed above, the (110) orientation generally favors hole mobility and therefore the silicon layer 110 may be formed in areas where p-channel MOSFETs will be fabricated. FIG. 1 shows a gate structure 130 for a MOSFET, which in this simple example includes gate dielectric 131 (e.g., silicon dioxide), gate conductor 132 (e.g., polycrystalline silicon), and dielectric spacers 133 (e.g., silicon nitride). It is understood that other embodiments of the invention may utilize more complex gate structures, including for example high-dielectric-constant (high-K) dielectrics, multiple spacers of different materials, and multiple conducting layers (e.g., silicides or metals). The MOSFET may be isolated from neighboring devices by dielectric regions 120, e.g., silicon dioxide regions formed by a shallow trench isolation (STI) process. Although the STI process is used an illustration, it is not required for the practice of the invention, and other embodiments may employ different isolation techniques, such as local oxidation of silicon (LOCOS).

Figure 2:
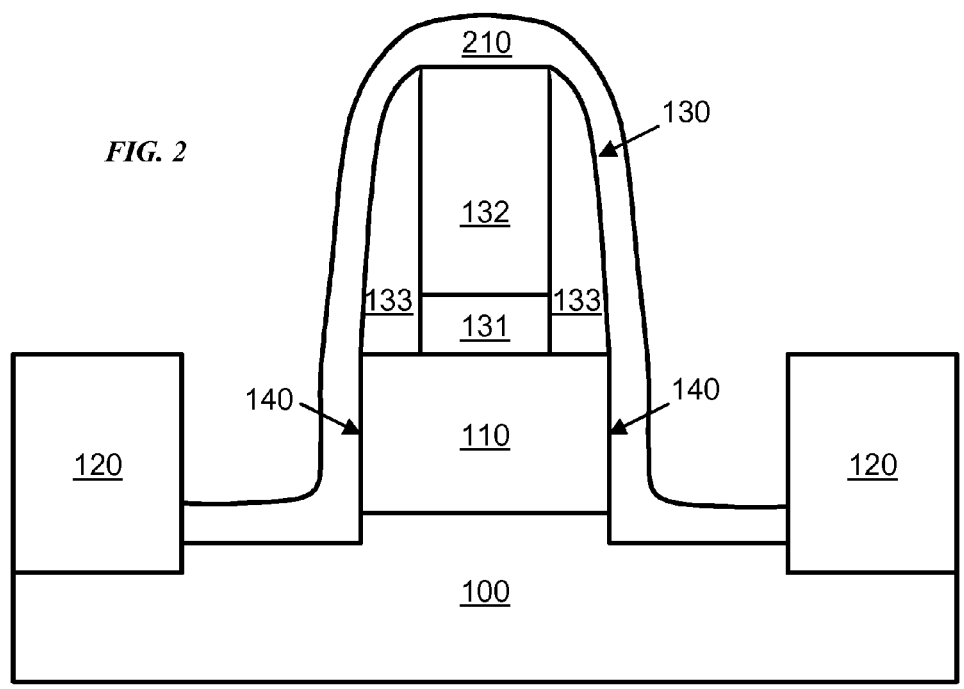
FIG. 2 shows a cross-section of a semiconductor device at a second intermediate step during fabrication in an embodiment of the invention.

FIG. 2 shows a cross-section of a semiconductor device at a second intermediate step during fabrication in an embodiment of the invention. Both the silicon layer 110 and the silicon substrate 100 may be recessed, for example by an anisotropic reactive ion etching (RIE) process. The recessing step may define two vertical sidewalls 140 and expose the interface between the silicon layers 110 and 100, which as mentioned above is often a site for lattice defects and leakage. The recessing step is preferably self-aligned to the gate structure 130, for example by using the gate structure itself as a mask for an etching process. A self-aligned process has the advantage of not requiring an additional mask and also maintains a constant alignment between the edges of the gate structure 130 and the sidewalls 140 formed by the recessing step. As discussed below, the alignment need not be perfect, but a horizontal offset may exist between the edges of the gate structure 130 and the vertical sidewalls 140.

After the recessing step, dielectric layer 210 may be deposited. For example, the dielectric layer 210 may be silicon nitride formed by chemical vapor deposition (CVD). CVD nitride layers are generally conformal and cover the entire exposed surface, however such complete coverage is not required for the practice of the invention. Other dielectric materials may also be used, such as silicon dioxide. In this embodiment, the dielectric layer 210 covers the exposed interface between silicon layers 110 and 100. Preferably, the thickness of the dielectric layer is in the range of 10 to 50 nm.

In the embodiment of FIG. 2, the sidewalls 140 are shown as perfectly aligned to the gate structure 130 with no offset. This is obviously an idealization as any real process will result in a finite offset. For example, an etch step may be used that intentionally produces some degree of etching under the gate structure. In that case, the dielectric layer 210 may cover less than the entire exposed surface. For example, it is possible that the dielectric layer 210 may not be deposited on the underside of the gate structure 130 and possibly part of the sidewalls of the silicon layer 110 and the silicon substrate 100. This, however, would still allow carrying out the performance of the remaining steps of the process as described below.

Figure 3:
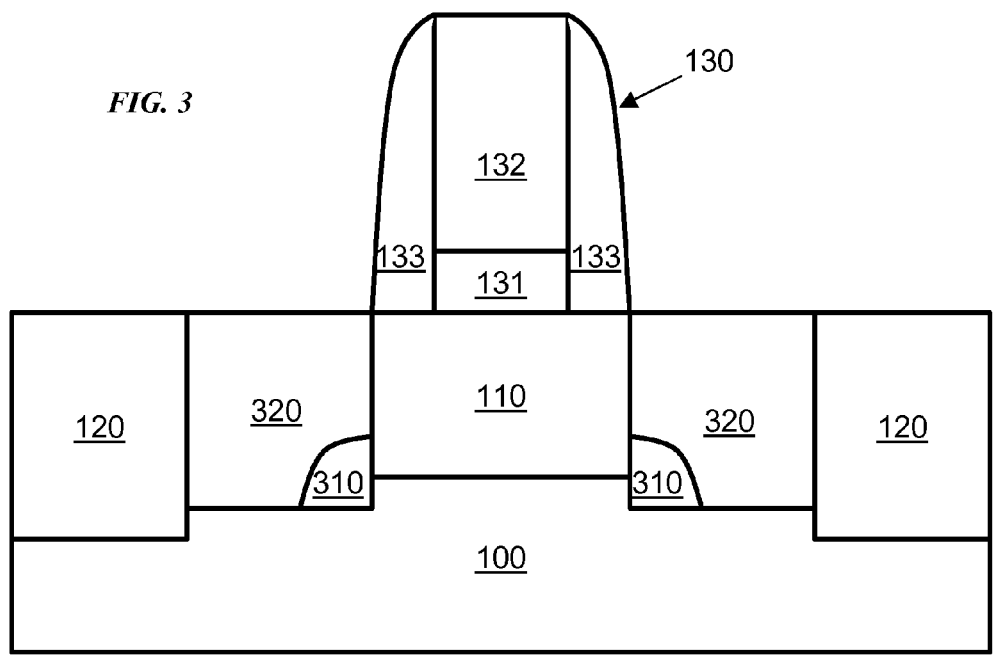
FIG. 3 shows a cross-section of a semiconductor device at a third intermediate step during fabrication in an embodiment of the invention.

FIG. 3 shows a cross-section of a semiconductor device at a third intermediate step during fabrication in an embodiment of the invention. An etchback step is used to remove part of the dielectric layer 210 to form embedded spacers 310. For example, an isotropic RIE step may be used. In this embodiment of the invention, embedded spacers 310 cover the exposed interface between silicon layers 110 and 100. After the embedded spacers 310 have been formed, semiconducting regions 320 may be formed. The choice of materials for the semiconducting regions will depend on the polarity of the charge carriers and the design of the device. Available materials include epitaxial silicon, silicon-germanium (SiGe), and carbon-doped silicon (Si:C). The materials are preferably SiGe for p-channel MOSFETs and Si:C for n-channel MOSFETs. The source and drain of the MOSFET may be formed in semiconducting regions 320 according to a conventional CMOS process flow.

The embedded spacers 310 may be effective for preventing leakage between source and drain of the MOSFET. This improves the ratio between the device's on-current and off-current even at very short channel lengths, and therefore simultaneously achieves lower power consumption and high performance.

The deposition-etchback process that forms the embedded spacers 310 may be employed to simultaneously form part of the gate structure 130, in particular the dielectric spacers 133. Since the deposition of the dielectric layer 210 is typically conformal, it will also cover the entire gate structure, and the etchback step may leave residues that may be advantageously used as part of the dielectric spacers 133.

As an alternative to the deposition-etchback process shown in FIGS. 1 through 3, the dielectric spacers 133 may be formed by other techniques, for example by uniformly oxidizing the entire exposed surface after the recessing step, and then selectively removing the oxide by an etching process similar to the process that results in the structure of FIG. 3.

Figure 4:
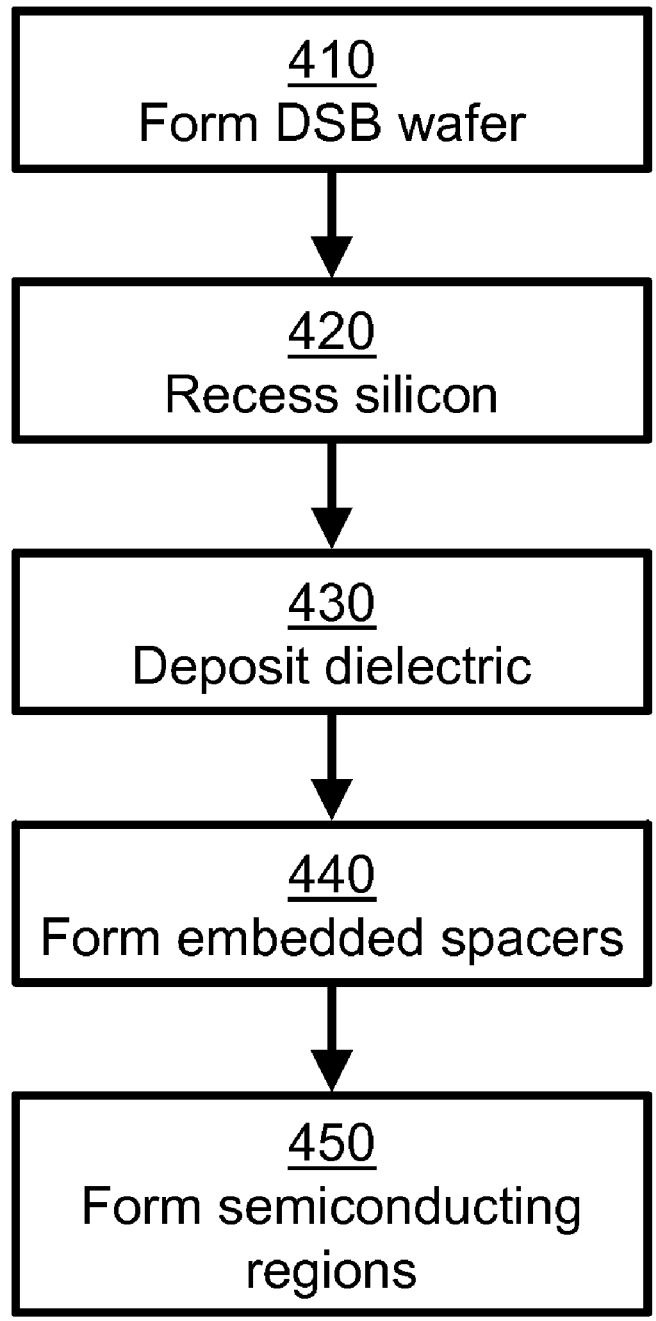
FIG. 4 shows a flow diagram for a fabrication process in an embodiment of the invention.

FIG. 4 shows a flow diagram for a fabrication process in an embodiment of the invention. The process may be best understood by reference to the various steps illustrated in FIGS. 1 through 3. At step 410, a DSB wafer may be formed, for example including a silicon substrate and a silicon layer of two different orientations. At step 420, both the silicon layer and the substrate may be recessed, for example by an isotropic reactive ion etching (RIE) process. At step 430, a dielectric layer may be deposited over the resulting structure. At step 440, embedded spacers may be formed by removing part of the dielectric layer. At step 450, semiconducting regions may be formed.

Figure 5:
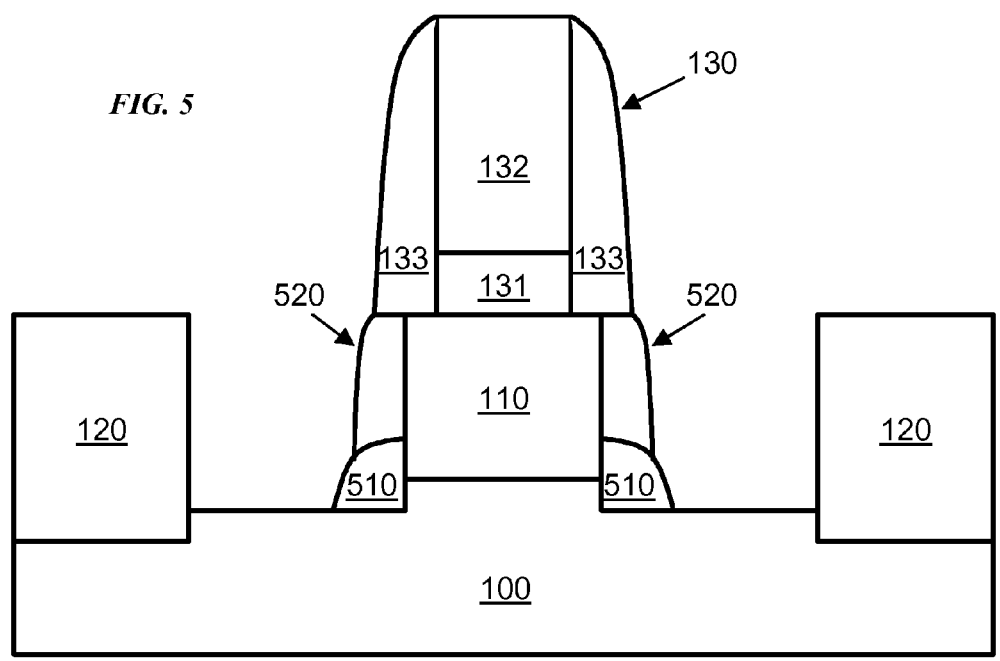
FIG. 5 shows a cross-section of a semiconductor device at an intermediate step during fabrication in an alternative embodiment of the invention.

FIG. 5 shows a cross-section of a semiconductor device at an intermediate step during fabrication in an alternative embodiment of the invention. The embodiments of FIGS. 1 through 3 employ a single dielectric layer 210. Other embodiments of the invention may utilize more than one recessing step, more than one dielectric layer, and more than one etchback step, to form the embedded spacers. For example, in a first part of the process the silicon layer 110 may be only partially recessed. A first dielectric layer, for example silicon nitride, may then be deposited and etched back by RIE to form an upper spacer 520. Upper spacer 520 may cover only part of the exposed sidewalls of silicon layer 110, but not the exposed interface between the silicon layers 110 and 100. In a second part of the process, a second recess step may be carried out, extending into the substrate 100 and exposing the interface between silicon layers 110 and 100. A second oxide layer may then be deposited and etched back by RIE to form embedded spacers 510, which cover the remaining part of the sidewalls, including the interface. The upper spacers 520 may be removed before forming the semiconducting regions 320.

Embodiments of the inventions have been specifically described for the case of a bulk silicon substrate, however other embodiments may also be applied to different substrates, such as silicon-on-insulator (SOI). Moreover, other embodiments may apply to material systems comprising other semiconductor materials, such as germanium and silicon-germanium (SiGe) alloys. Finally, embodiments of the invention may apply to material systems including any combination of strained and unstrained layers.

The methods and structures as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in conjunction with specific embodiments, it will be appreciated that such embodiments are not limiting. Accordingly, numerous alternatives, modifications, and variations are possible within the scope of the appended claims.

We claim:

1. A semiconductor device comprising:
a silicon substrate having a first crystal orientation;
a silicon layer having a second crystal orientation, the silicon layer being bonded to a surface of the silicon substrate;
a gate structure formed over the silicon layer;
two recesses formed in the silicon layer and in the silicon substrate, the recesses defining two vertical sidewalls self-aligned to the gate structure, the sidewalls exposing an interface between the silicon layer and the silicon substrate;
two dielectric spacers, each dielectric spacer being formed on a respective sidewall and covering the exposed interface; and
two semiconducting regions, each semiconducting region being formed in a respective recess and embedding one of the dielectric spacers within the semiconductor device.

* * * * *